(12) United States Patent
Xiao et al.

(10) Patent No.: US 7,679,324 B2
(45) Date of Patent: Mar. 16, 2010

(54) NON-COMMON GROUND SERIES BUS PHYSICAL LAYER IMPLEMENTATION

(75) Inventors: Sean Xiao, Shanghai (CN); Oleksandr Kokorin, San Jose, CA (US)

(73) Assignee: O2Micro International Limited, Grand Cayman (KY)

( * ) Notice: Subject to any disclaimer, the term of this patent is extended or adjusted under 35 U.S.C. 154(b) by 908 days.

(21) Appl. No.: 11/282,426

(22) Filed: Nov. 18, 2005

(65) Prior Publication Data

US 2006/0176019 A1 Aug. 10, 2006

Related U.S. Application Data

(60) Provisional application No. 60/649,960, filed on Feb. 4, 2005.

(51) Int. Cl.
*H02J 7/00* (2006.01)
(52) U.S. Cl. .................. 320/116; 324/426; 324/434
(58) Field of Classification Search .......... 320/116; 324/426, 429, 433, 434
See application file for complete search history.

(56) References Cited

U.S. PATENT DOCUMENTS

2003/0044689 A1* 3/2003 Miyazaki et al. ............ 429/320

* cited by examiner

*Primary Examiner*—Edward Tso
*Assistant Examiner*—Ramy Ramadan

(57) ABSTRACT

A communication circuit is used for transmitting data between a plurality of devices which have non-common ground voltages. The communication circuit comprises a plurality of transmitting input nodes coupled to the devices, respectively, a transmitting current path, a plurality of receiving output nodes coupled to the devices, respectively, and a receiving current path. The transmitting current path is coupled to the transmitting input nodes. The current through the transmitting current path is varied according to the input signal of the transmitting input nodes. The receiving current path is coupled to the receiving output nodes. The current through the receiving current path is varied according to the current of the transmitting current path such that data is transmitted from the transmitting input nodes to the receiving output nodes.

19 Claims, 9 Drawing Sheets

NON-COMMON GROUND SERIES BUS PHYSICAL LAYER IMPLEMENTATION

CROSS REFERENCE TO PROVISIONAL APPLICATION

This application claims priority to the co-pending provisional patent application, Ser. No. 60/649,960, entitled "Non-Common Ground Series Bus Physical Layer Implementation," with filing date Feb. 4, 2005, and assigned to the assignee of the present invention, which is herein incorporated by reference in its entirety.

TECHNICAL FIELD

The present invention relates generally to the field of signal communication, such I2C BUS, LIN BUS, SMBUS, series bus etc., and more specifically to the non-common ground extends of the series bus. Specifically, the present invention relates to the non-common ground communication without coupling devices.

BACKGROUND ART

In battery management, it is always needed to monitor the status of a battery, such as the voltage of the battery, by Analog Front End (AFE) devices. The analog front end device is coupled to the battery and accesses digital data regarding status, such as voltage of the battery. The digital data will be transferred to the microprocessor for various purposes, such as coulomb counting or protection purpose.

With increasing the number of the cells of the stacked battery, the voltage of the stacked battery will become higher and higher. Further, the voltage capacity of analog front end device is limited by the pin count of the AFE device or the physical process breakdown voltage of the AFE device. In this case, only one analog front end device will not be able to monitor the whole stacked battery. Therefore, a plurality of analog front end devices are used to monitor the status of the stacked battery and it is needed to establish a communication path between the microprocessor and each analog front end device.

Referring to Prior Art FIG. 1, it shows a block diagram of a communication construction or a bus 10 between a stacked battery 20 and a microprocessor 15. The stacked battery comprises a plurality of battery blocks or packs, 22, 24, . . . and 26. A plurality of analog front end devices 12, 14 . . . and 16 are stacked and are coupled to the battery packs 22, 24 . . . and 26, respectively, for monitoring the status of each of the battery packs 22, 24 . . . and 26. In other words, each of the analog front end devices 12, 14 . . . and 16 only monitors a portion of the stacked battery 20. A bus 10 is coupled to the analog front end devices 12, 14 . . . and 16. It has been found that the analog front end devices 12, 14 . . . and 16 do not have a common ground voltage and, as such, the varied ground voltages need to be isolated. Conventionally, a coupling device, such as optical coupler, inductor or capacitor, is used to establish an external communication path between the AFE blocks 12, 14 . . . and 16 and the microprocessor 15. The non-common ground signal is transferred through the coupling devices, such as optical couplers, inductors or capacitors. Those approaches are complex and expensive.

SUMMARY OF THE INVENTION

It is an object of the present invention to implement the non-common ground communication without coupling devices. That is, it is an object of the present invention for a non-common ground communication system or bus circuit which is able to establish a communication path between bus blocks which do not have a common ground voltage.

In order to achieve the above object, the present invention provides a communication circuit for transmitting data between a plurality of devices which have non-common ground voltages. The communication circuit comprises a plurality of transmitting input ends coupled to the devices, respectively, a transmitting current path, a plurality of receiving output ends coupled to the devices, respectively, and a receiving current path. The transmitting current path is coupled to the transmitting input ends. The current through the transmitting current path is varied according to the input signal of the transmitting input ends. The receiving current path is coupled to the receiving output ends. The current through the receiving current path is varied according to the current of the transmitting current path such that data is transmitted from the transmitting input ends to the receiving output ends.

According to another aspect of the present invention, the present invention provides a communication circuit for transmitting data between a plurality of devices which have a plurality of float voltage sources coupled in series. The communication circuit comprises a first node, a plurality of second nodes, a plurality of outputting ends, and a plurality of switches. The first node is coupled to one of the devices which has a highest or lowest voltage between the voltages of the voltage sources, and has a first node voltage source coupled in series with load resistor. The voltage across the first node voltage source is proportional to and smaller than the voltage across the one of the devices. The second nodes are coupled to the rest of the devices, respectively, and have a plurality of second node voltage sources, respectively. The voltages across the second voltage sources are substantially equal to the voltages across the rest of the devices, respectively. The first and second node voltage sources are coupled in series. The outputting ends are coupled to the first and second node voltage sources. The switches are used for optionally coupling the first and second node voltage sources to the voltage source of the devices such that the output voltages of the outputting ends are varied according to the status of the switches.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE INVENTION

Reference will now be made in detail to the embodiments of the present invention, non-common ground series bus physical layer implementations. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
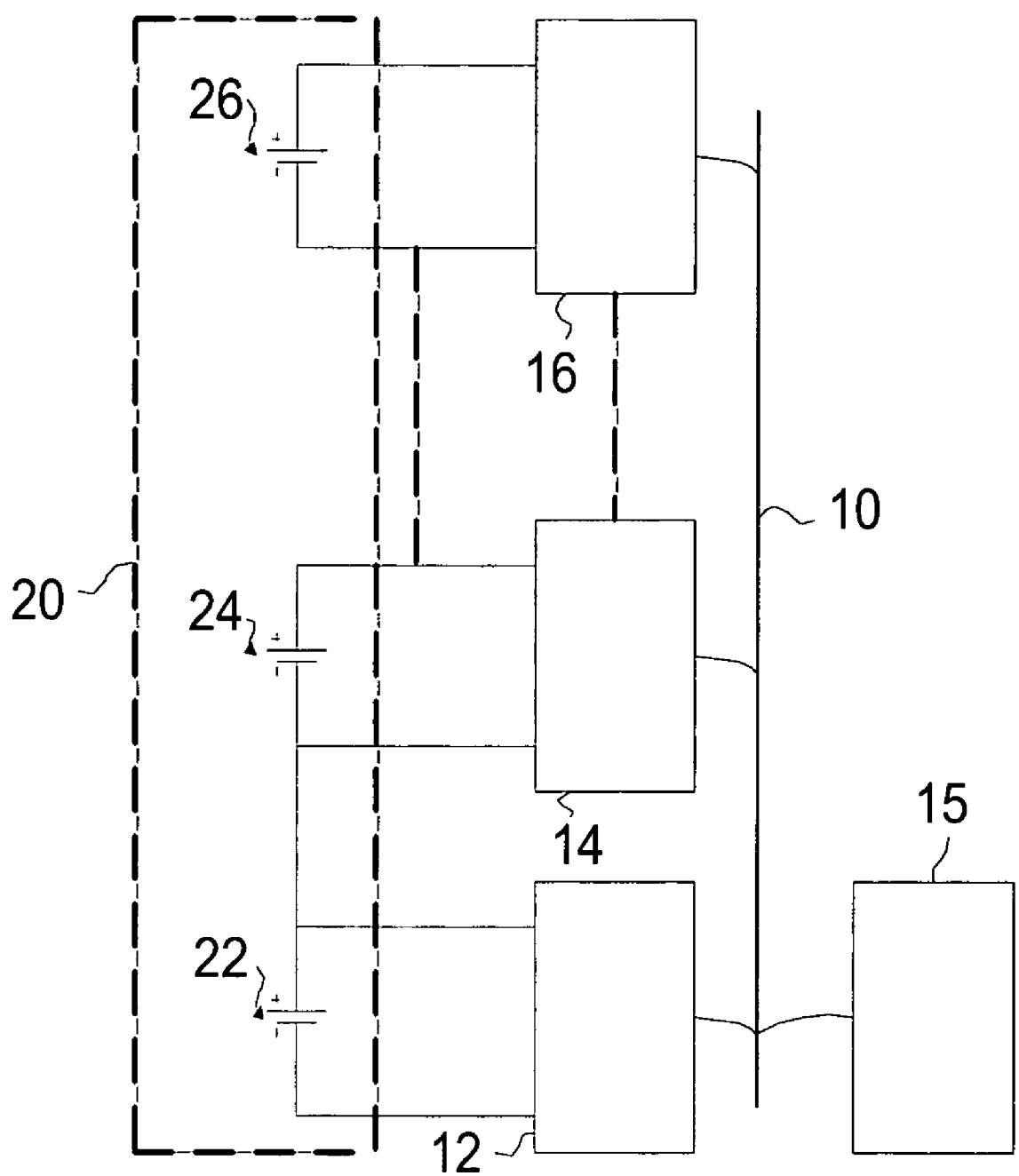
FIG. 1 is a block diagram of a stacked battery cells coupled to a micro processor through analog front end devices and a bus in prior art.
Figure 2:
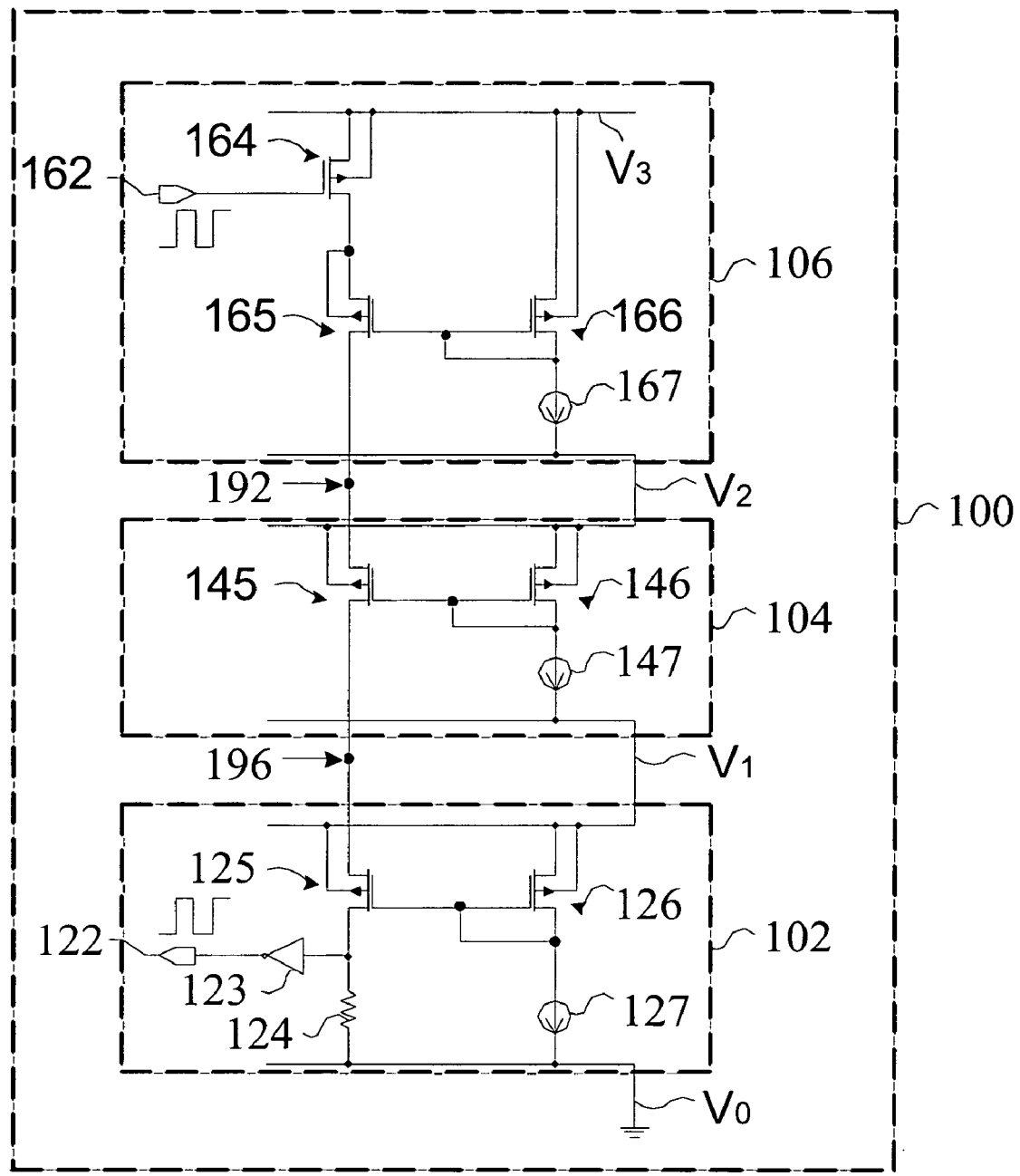
FIG. 2 is a block diagram showing a non-common ground bus topology or circuit according to an embodiment of the present invention.

Referring to FIG. 2, a non-common ground bus circuit 100 according to an embodiment of the present invention is illustrated. As illustrated in FIG. 2, the non-common ground bus circuit 100 includes three bus blocks 102, 104, and 106. The bus blocks 102, 104, and 106 stand on various voltage, (e.g., $V_0$ or ground, $V_1$, and $V_3$). It will be apparent to those skilled in the art that the non-common ground bus circuit 100 may include more or less than three bus blocks, in accordance with embodiments of the present invention.

In the non-common ground bus circuit 100, the input voltage signal is input from node 162. The input voltage signal is converted to a current signal. In another embodiment of the present invention, the input signal may be a current signal, in which case this step or process can be eliminated. Then, the current signal is transmitted between the bus blocks 102, 104, and 106, and the current signal is converted to a voltage signal output from a node 122. As such, the input signal is transmitted from the high common voltage end to the low common voltage end.

The bus block 102 includes a MOSFET 125, a MOSFET 126 and a current source 127 which are configured as a current mirror. Similarly, the bus block 104 includes a MOSFET 145, a MOSFET 146, and a current source 147 configured as a current mirror, and the bus block 106 includes a MOSFET 165, a MOSFET 166, and a current source 167 configured as a current mirror.

As illustrated in FIG. 2, when the input voltage is in a low state, IN=0, a switch or a MOSFET 164 will be turned on. That is, when the input voltage is less than V3 for more than a certain value, such as 0.8 volts, the MOSFET 164 will be turned on. The MOSFET 165 and the MOSFET 166 are formed as a current mirror such that current flows through a current path which is from $V_3$ to $V_0$ or ground through the MOSFET 164, MOSFET 165, the MOSFET 145 and the MOSFET 125. This current also flows to $V_0$ through a resistor 124 and a voltage signal is generated at the resistor 124. In other words, the resistor 124 converts the current signal to a voltage signal. An INVERTER gate 123 is coupled to the resistor 124 to output an output signal at node 122. It will be appreciated that the output voltage will be in a low state, OUT=0, i.e., the output voltage at the node 122 in the bus block 102 is equal to 0 or ground, when the input voltage is in a low state.

On the other hand, when the input voltage is in a high state, IN=1, the MOSFET 164 will be turned off. That is, the input voltage is less than V3 for less than a certain value, such as 0.3 volts, the MOSFET 164 will be turned off. The current will not flow through the current path and the input of the INVERTER gate 123 will be in a low state such that the output voltage is in a high state, OUT=1, i.e. the output voltage at the node 122 in the bus block 102 is equal to V1. Accordingly, it observed that the signal from the bus block 106 (High common voltage end: VDD=V3, GND=V2) can be transferred to the bus block 102 (Low common voltage end: VDD=V1, GND=V0). Communication between non common ground bus blocks is described in detail in FIG. 7, FIG. 8a and FIG. 8b.

Furthermore, it is observed that the maximum voltage dropped across the MOSFET 125, MOSFET 145, and MOSFET 165 in the current path is approximately equal or less to the difference between the voltages of the power supply of the bus blocks 102, 104, and 106. For example, the maximum voltage dropped across the MOSFET 145 of the bus block 104 is showed as follows in equations 1-3:

$$\text{Vds of MOSFET 145} = \text{Voltage of node 192 } (V_{192}) - \text{Voltage of node 196 } (V_{196}); \quad (1)$$

$$V_{192} = V_2 - \text{Vgs of the MOSFET 146} + \text{Vgs of the MOSFET 145} \approx V_2; \quad (2)$$

$$V_{196} = V_1 - \text{Vgs of the MOSFET 126} + \text{Vgs of the MOSFET 125} \approx V_1. \quad (3)$$

Therefore, Vds of the MOSFET 145 is approximately equal to $(V_2-V_1)$. It will be apparent to those skilled in the art that the high voltage, $V_3$, is not applied to any single MOSFETs but is separated into several small voltages.

Figure 3:
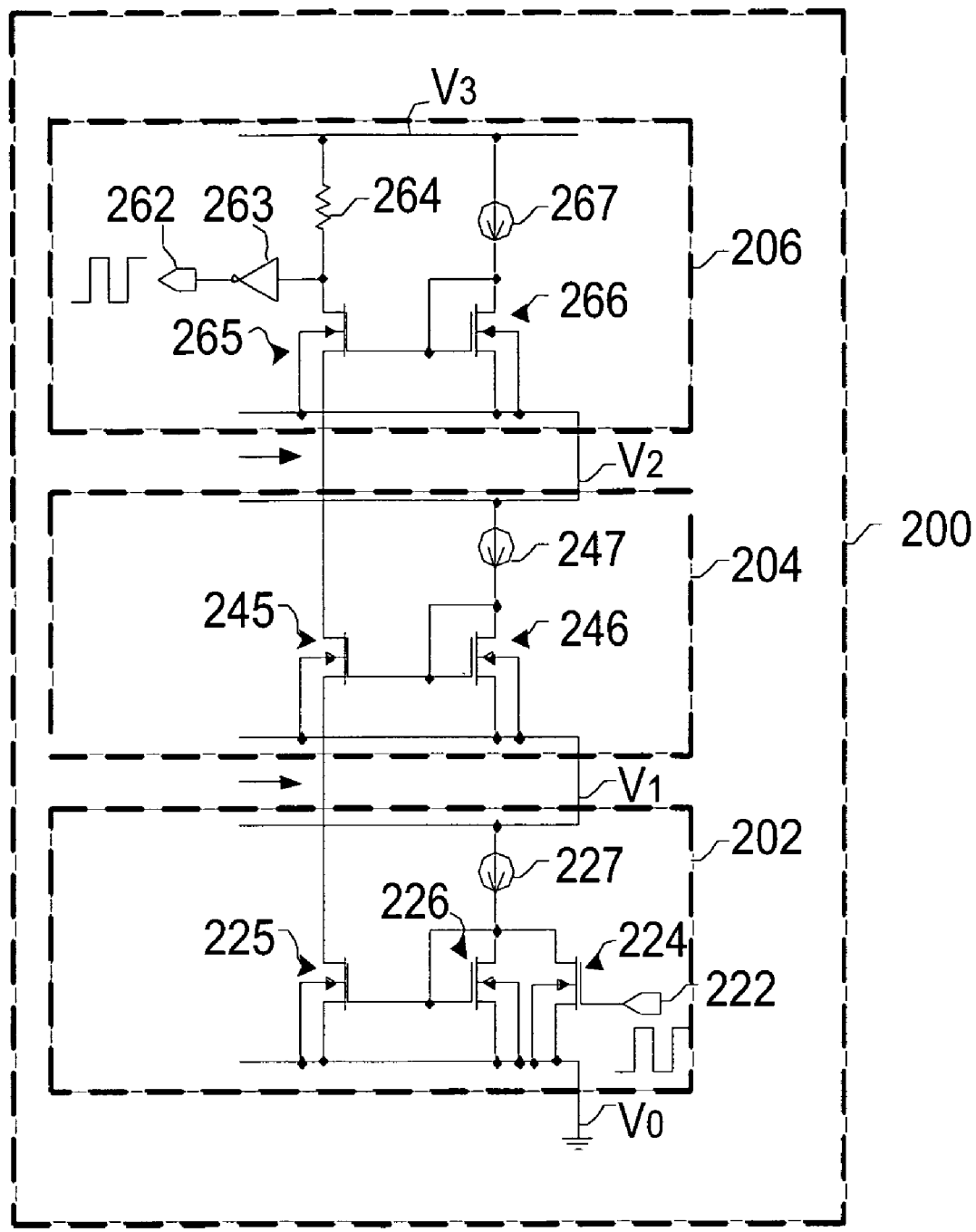
FIG. 3 is a block diagram showing a non-common ground bus topology or circuit according to an embodiment of the present invention.

Referring to FIG. 3, a non-common ground bus circuit 200 according to an embodiment of the present invention is illustrated. As illustrated in FIG. 3, the non-common ground bus circuit 200 includes three bus blocks 202, 204, and 206, and the bus blocks 202, 204, and 206 stand on various voltages [e.g. $V_0$ (or ground), $V_1$, and $V_3$]. It will be apparent to those skilled in the art that the non-common ground bus circuit 200 may include more or less than three bus blocks.

In the non-common ground bus circuit 200, the input voltage signal is input from node 222. When the input voltage is in a high state, a switch or a MOSFET 224 will be turned off. A current source 227, a MOSFET 226 and a MOSFET 225 are formed as a current mirror such that current flows through a current path which is from $V_3$ to $V_0$ or ground through a MOSFET 265, a MOSFET 245, and the MOSFET 225. This current also flows through a resistor 264 and a voltage signal is generated at the resistor 264. The resistor 264 converts the current signal to a voltage signal. An INVERTER gate 263 is coupled to the resistor 264 to output an output signal at node 262. It will be appreciated that the output voltage at node 262 in the bus block 206 is in a high state, when the input voltage at node 222 is in a high state.

When the input voltage is in a low state, the MOSFET 224 will be turned on. The current of the current source 227 flows through the MOSFET 224. There will not be any current through the resistor 264. The input of the INVERTER gate 263 will be in a high state and the output voltage at node 262 will be in a low state.

Therefore, the input voltage signal is converted to a current signal by a current mirror and a switch 224. Then, the current signal is transmitted from the bus blocks 202, to 206 through the bus block 204, and then the current signal is converted to an output voltage signal which is output from a node 262. The input signal is transmitted from the low common voltage end to the high common voltage end.

Figure 4:
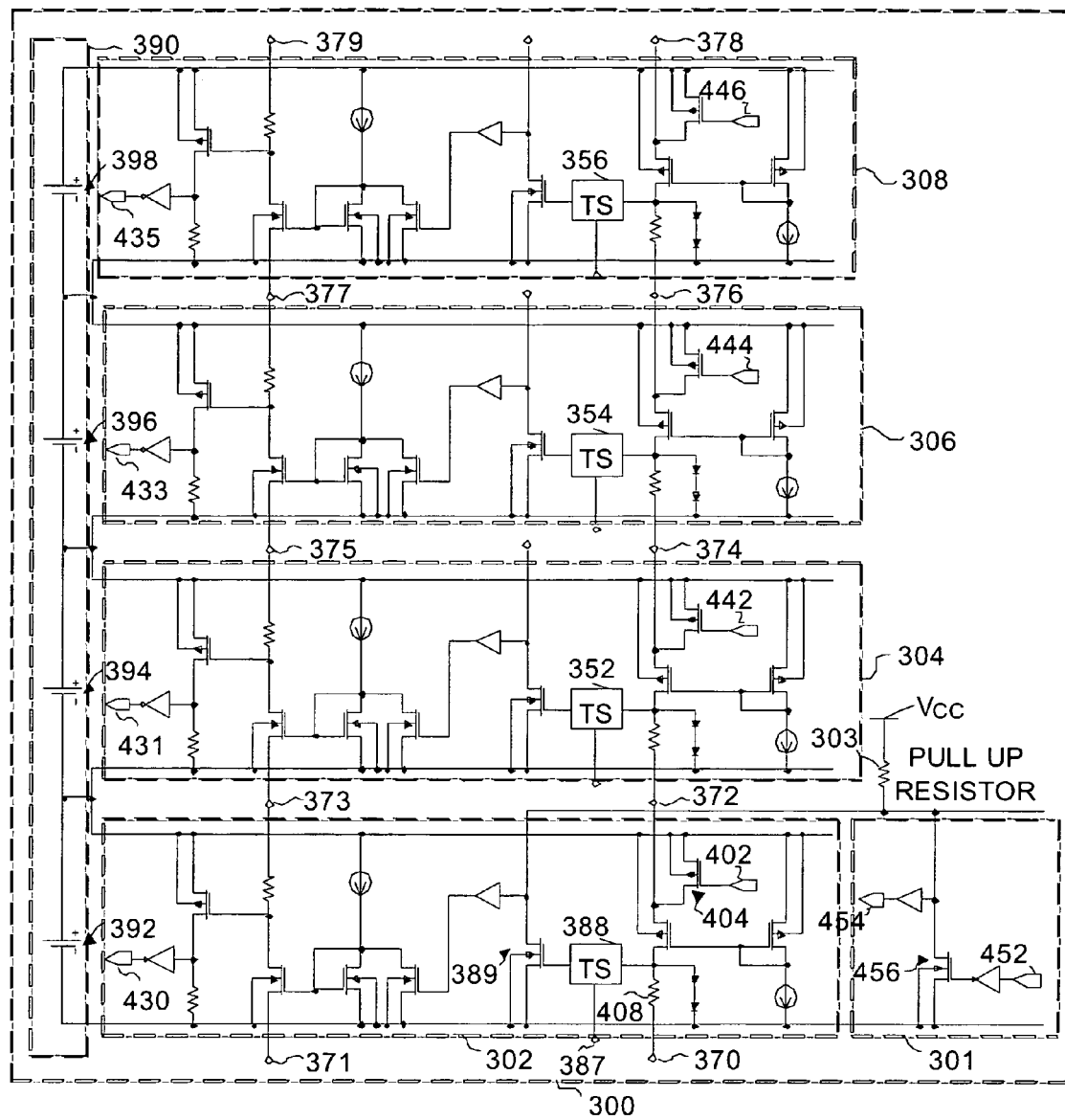
FIG. 4 is a block diagram showing a non-common ground bus topology or circuit according to an embodiment of the present invention.
Figure 5:
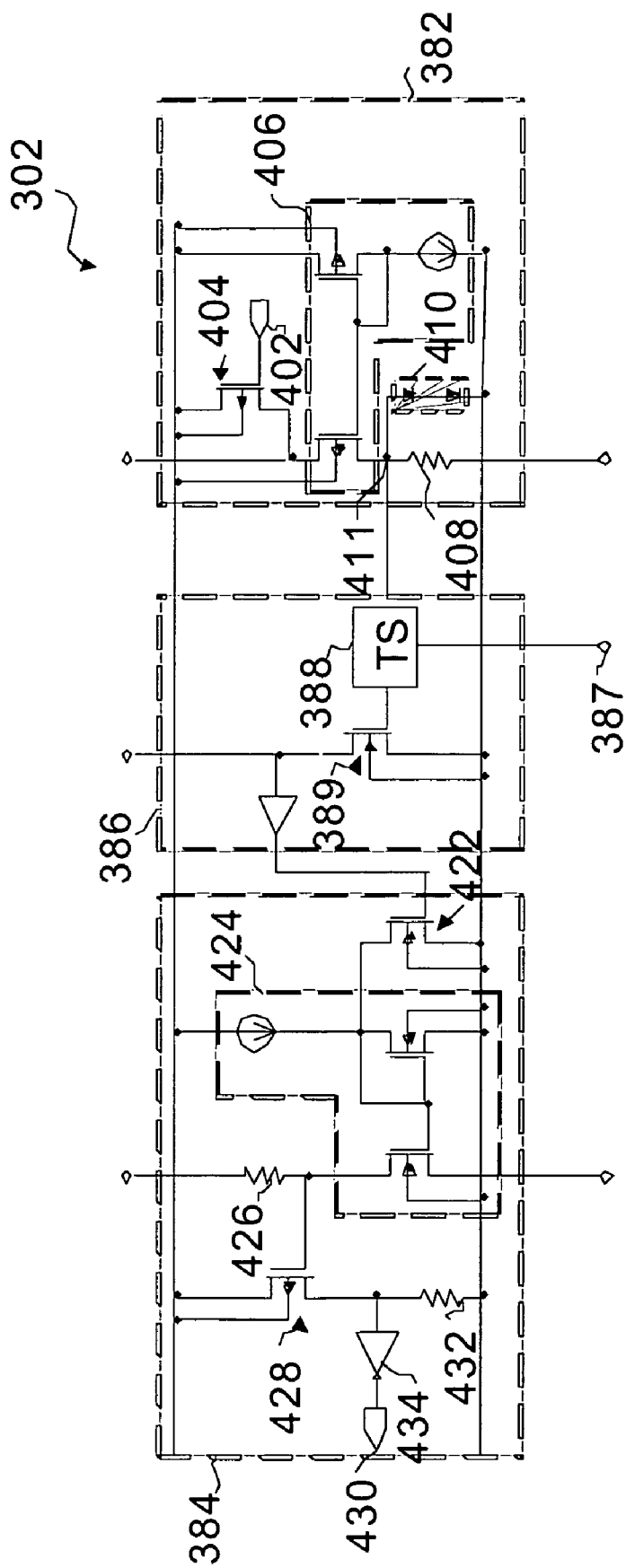
FIG. 5 is an enlarged block diagram showing a bus circuit of the non-common ground bus circuit shown in FIG. 4 according to an embodiment of the present invention.

Referring to FIGS. 4 and 5, a non-common ground vertical bus circuit 300 according to embodiments of the present invention are illustrated. The vertical bus circuit 300 includes a plurality of bus blocks 302, 304, 306, and 308 that are coupled to a lateral bus block 301. For purposes of illustration, four bus blocks are shown in FIG. 4, and, however, it is appreciated that embodiments of the present invention are able to support one or more bus blocks. The lateral bus block 301 has a common ground with the bus block 302. The lateral bus 301 is a typical bus block having a transmitting node 452 and a receiving node 454 for transmitting and receiving signals. For example, the bus blocks 302, 304, 306, and 308 are coupled to a plurality of battery packs 392, 394, 396, 398 of a battery 390, respectively. A plurality of devices, such as analog front end devices, not shown, are also coupled to the bus blocks 302, 304, 306, 308, respectively. A microprocessor, not shown, may also be coupled to the lateral bus block 301 such that the digital data, such as the voltage values of the battery packs 392, 394, 396, 398, is able to be transmitted to the microprocessor. For example, an analog front device may be coupled to the battery pack 392 for converting the voltage of the battery pack 392 into a digital signal and transmitting the digital signal to the microprocessor. Each of the bus blocks 302, 304, 306, 308 can be identical and be formed as an individual integrated circuit which can be coupled in series and coupled to the battery 390.

Preferably referring to FIG. 5, the bus block 302 includes a signal transmitting circuit 382, a signal receiving circuit 384, and a switch circuit 386. The switch 386 is served as a common ground compatible transceiver to transmit and receive a common ground signal. The switch circuit 386 is enabled only in the common ground node or the lowest bus block 302. The signal transmitting circuit 382 is similar to the bus blocks 102 and 106 shown in FIG. 2 and the signal receiving circuit 384 is similar to the bus blocks 202 and 206 shown in FIG. 3.

The signal transmitting circuit 382 includes a transmitting node 402 coupled to a MOSFET 404 and a current mirror 406 for converting a voltage signal to a current signal. The current of the current signal flows through a resister 408 to be converted to a voltage signal. A protection circuit 410 is coupled to the resistor 408 and clamps or limits the voltage at 411 to a certain value for protecting the circuit from over-voltage.

The signal receiving circuit 384 includes a MOSFET 422 and a current mirror 424 for converting the voltage signal to the current signal. A resistor 426 coupled to the current mirror 424 converts the current signal to the voltage signal. The voltage signal will be output at the node 430 by a MOSFET 428, a resistor 432 and an INVERTER gate 434.

The switch circuit 386 includes a switch 388 and a MOSFET 389 for opening or closing the data communication path between the transmitting portion 382 and the receiving portion 384.

Referring now back to FIG. 4, while operating the non-common ground vertical bus circuit 300, according to the embodiment of the present invention, the transmitting node of any of the bus blocks 302, 304, 306, 308 or the transmitting node 452 of the lateral bus blocks 301 can be used to transmit a signal. In addition, all of the receiving nodes 430, 431, 433, 435 of the bus blocks 302, 304, 306, 308 and the receiving node 454 of the lateral bus block 301 can be used for receiving the signal.

For example, when a signal is transmitted at any vertical transmitting node of 402, 442, 444, or 446, the resistor 408 will receive a current signal through the transmitting current path, which includes the nodes 370, 372, 374, 376, and 378, and covert current signal to voltage signal. The voltage signal is transmitted to the receiving portion 384, as shown in FIG. 5, and then the receiving nodes 430, 431, 433, and 435 of the bus block 302, 304, 306, and 308 will output the signal. Similarly, when a signal is transmitted from the transmitting node 452 of the lateral bus block 301, the receiving nodes 430, 431, 433, and 435 of the bus block 302, 304, 306, and 308 will output the signal.

Each of the bus blocks 302, 304, 306, 308 can be formed as an identical integral circuit (IC) chip. The switch 388 of the lowest bus block 302 is controlled by a configuration pin 387. In the lowest stage, the switch 388 of the bus block 302 is kept opened (on state), and in the other stages, the switches 352, 354, 356 of the bus blocks 304, 306, 308 are kept closed (off state).

Furthermore, in the lowest stage, the switch 388 is kept opened and the voltage of the resistor 408 actuates the switch 389 to generate a voltage signal at a pull up resistor 303, which is coupled to a voltage source, Vcc. The voltage signal at the pull up resistor 303 actuates the MOSFET 422, as shown in FIG. 5, and the current mirror 424 such that a current will flow through the receiving current path which includes the nodes 371, 373, 375, 377, and 379. The node 371 is coupled to ground. The node 379 is coupled to the power of the bus block 308 if the bus block is the highest block. Then, all of the receiving nodes 430, 431, 433, 435 of the bus block 302, 306, 304, and 308 will receive a voltage signal. As illustrated in FIG. 4, the voltage signal at the pull up resistor 303 is also transmitted to a receiving node 454 of the lateral bus block 301.

Furthermore, when a signal is transmitted at the transmitting node 452 of the lateral bus block 301, the MOSFET 456 will be actuated and a current will flow through the pull up resister 303 such that a voltage will be generated at the pull up resistor 303 to actuate the MOSFET 422 and the current mirror 424. A current will flow through the receiving current path and all of the receiving nodes 430, 431, 433, 435 of the blocks 302, 306, 304, and 308 will receive a voltage signal. Therefore, each of the receiving nodes of the bus blocks, including the vertical bus blocks and lateral bus block, will receive a signal when the signal is transmitted from any of the bus blocks. In other words, each of the bus blocks, including the vertical and lateral bus blocks, can receive data from any one of the bus blocks at the same time.

Furthermore, for arbitration purposes, the WIRE AND function is needed for the series bus. Referring to FIG. 4, the bus blocks 302, 304, 306, 308 have the transmitting nodes 402, 442, 444, and 446, respectively. In this arrangement, the non-common ground bus circuit 300 according to the embodiment of the present invention implements the WIRE AND logical function. When any of the transmitting nodes 402, 442, 444, and 446 is in a low state, the current through the transmitting current path will be a certain value such that the voltage at the resistor 408 will be in a high state and the voltage at the pull up resistor 303 will be in a low state.

On the other hand, when all of the transmitting nodes 402, 442, 444, and 446 are in a high state, the current through the transmitting current path will be about zero, such that the voltage at the resistor 408 will be in a low state and the voltage at the pull up resistor 303 will be in a high state. In other words, if any of the logic values of the transmitting nodes 402, 442, 444, and 446 is 0, the logic value at the pull up resistor 303 is 0. Also, when each of the logic values of the transmitting nodes 402, 442, 444, and 446 are 1, the logic value at the pull up resistor 303 is 1.

Figure 6:
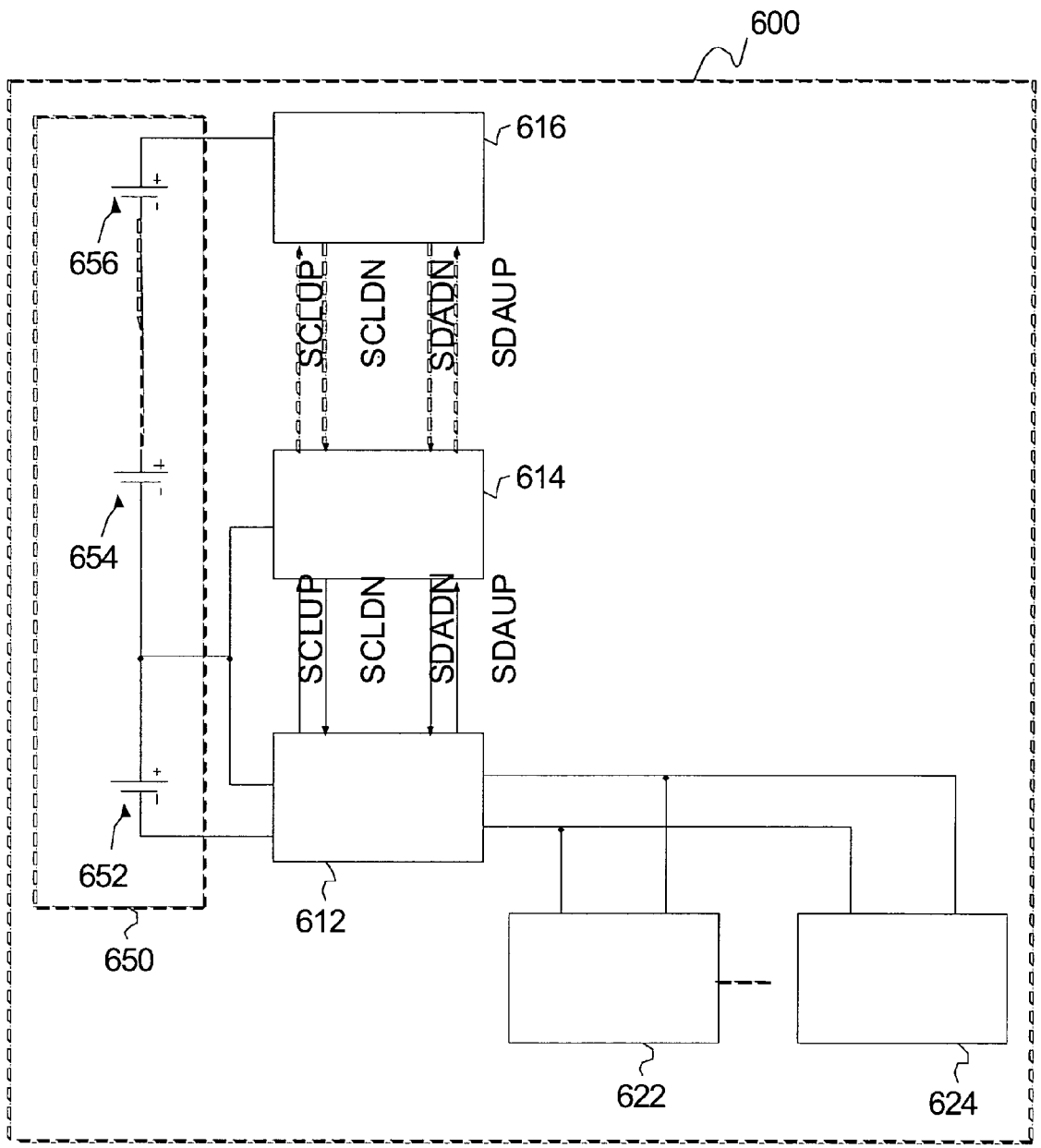
FIG. 6 is a block diagram showing a bus topology according to an embodiment of the present invention.

Referring to FIG. 6, a bus topology 600 according to an embodiment of the present invention is illustrated. The bus topology 600 is used for an I2C bus application. At the protocol level, it is same as the normal I2C application. The bus topology 600 includes a plurality of vertical bus block 612, 614 and 616 and a plurality of lateral bus block 622 and 624. For purposes of illustration, three bus blocks are shown in FIG. 6. However, it is appreciated that embodiments of the present invention are able to support one or more bus blocks. The vertical bus block 612, 614 and 616 are coupled to a plurality of battery blocks 652, 654 and 656 of a battery 650, respectively. According to the description hereinbefore, the vertical bus blocks 612, 614 and 616 stand on various voltages and are able to communicate with other bus blocks by the I2C protocol.

Figure 7:
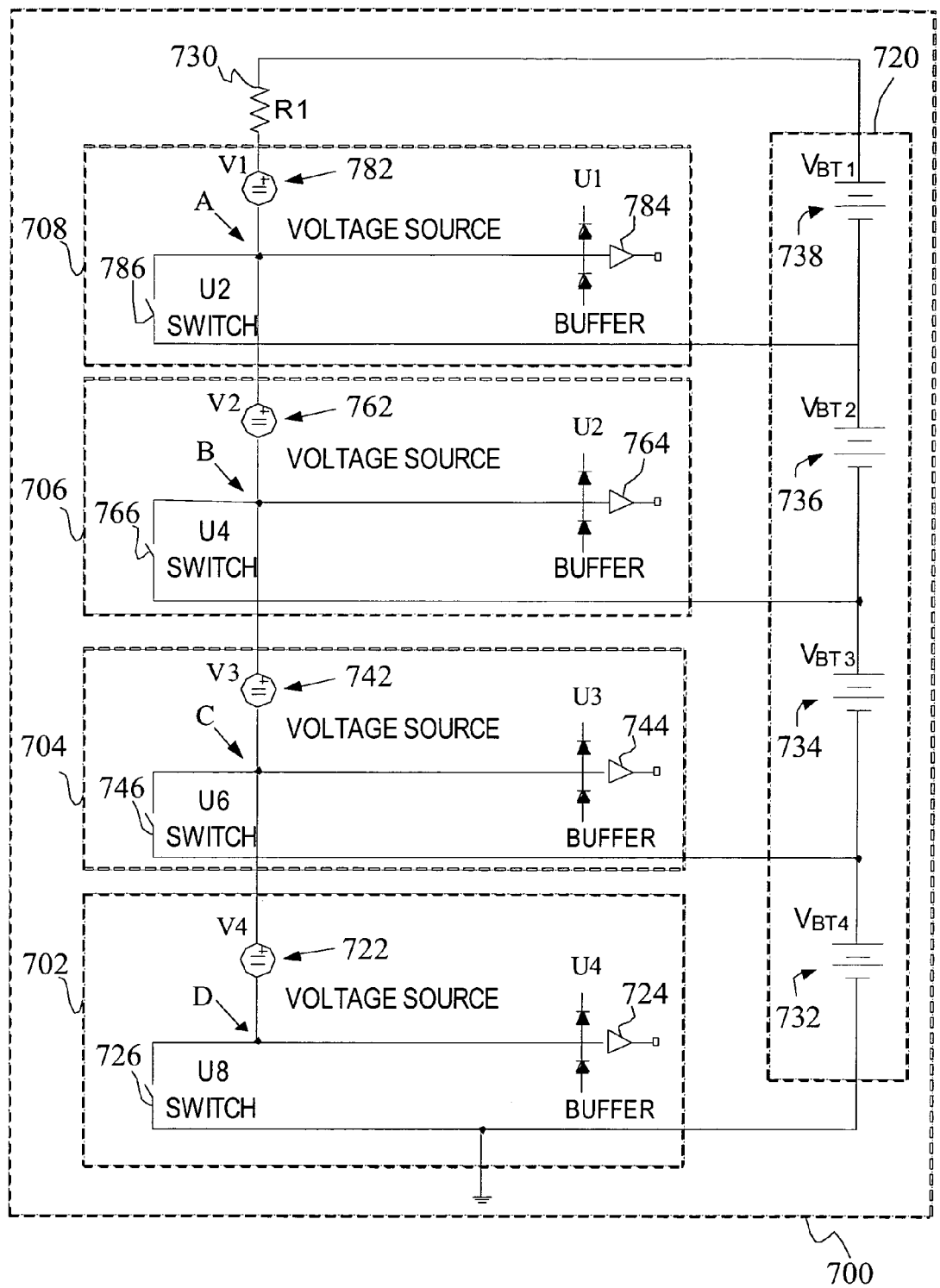
FIG. 7 is a block diagram showing a non-common ground bus topology or circuit with float voltage sources according to an embodiment of the present invention.

Referring to FIG. 7, a non-common ground bus circuit 700 according to an embodiment of the present invention is illustrated. As illustrated in FIG. 7, the non-common ground bus circuit 700 includes four bus blocks 702, 704, 706, and 708. The bus blocks 702, 704, 706, and 708, for example, are coupled to a plurality of battery packs 732, 734, 736, and 738 of a battery 730, respectively. It will be apparent to those skilled in the art that the non-common ground bus circuit 700 may include more than four bus blocks, which can be coupled to an equal number of battery packs.

The bus blocks 702, 704, 706, and 708 include a plurality of float voltage sources 722, 742, 762, and 782. Also, the bus blocks include buffers 724, 744, 764, and 784. Further, the bus blocks include switches 726, 746, 766, and 786.

In the non-common ground bus circuit 700 according to the embodiment of the present invention, the voltage across the voltage source 782 is equal to the voltage of the battery pack 738 times a coefficient K, where, for example, K may be equal 0.8, i.e., $V_1 = V_{BT1} * K$, where K=0.8. The voltages across the voltage sources 762, 742 and 722 are equal to the voltage of the battery packs 736, 734 and 732, respectively, (e.g., $V_2 = V_{BT2}$, $V_3 = V_{BT3}$, and $V_4 = V_{BT4}$).

In this arrangement, when all of the switches 726, 746, 766 and 786 are opened, the input voltages of the buffers 724, 744, 764 and 784 will be equal to the voltage difference between the voltage source 782 and the battery pack 738, (e.g., $V_{BT1} - V_1$).

If any one of the switches 726, 746, 766 and 786 are closed, the input voltages of the buffers 724, 744, 764 and 784 will be equal to the local ground. For example, in this case, the input voltage of the buffer 744 is equal to the voltage of the battery pack, 732, (e.g., $V_{BT4}$).

Therefore, the non-common ground bus circuit 700 meets the requirements of series buses, such I2C bus, and can be used for the same purpose in the system without common ground but coupled in series. The non-common ground bus circuit 700 according to the embodiment of the present invention is suitable for the battery, the voltage of which have tolerance, such as the battery used in electric vehicles.

Furthermore, the architecture of the non-common ground bus circuit 700 according to one embodiment of the present invention can be used to include CLOCK and DATA buses to comply with a bus protocol, such as I2C bus protocol.

Figure 8A:
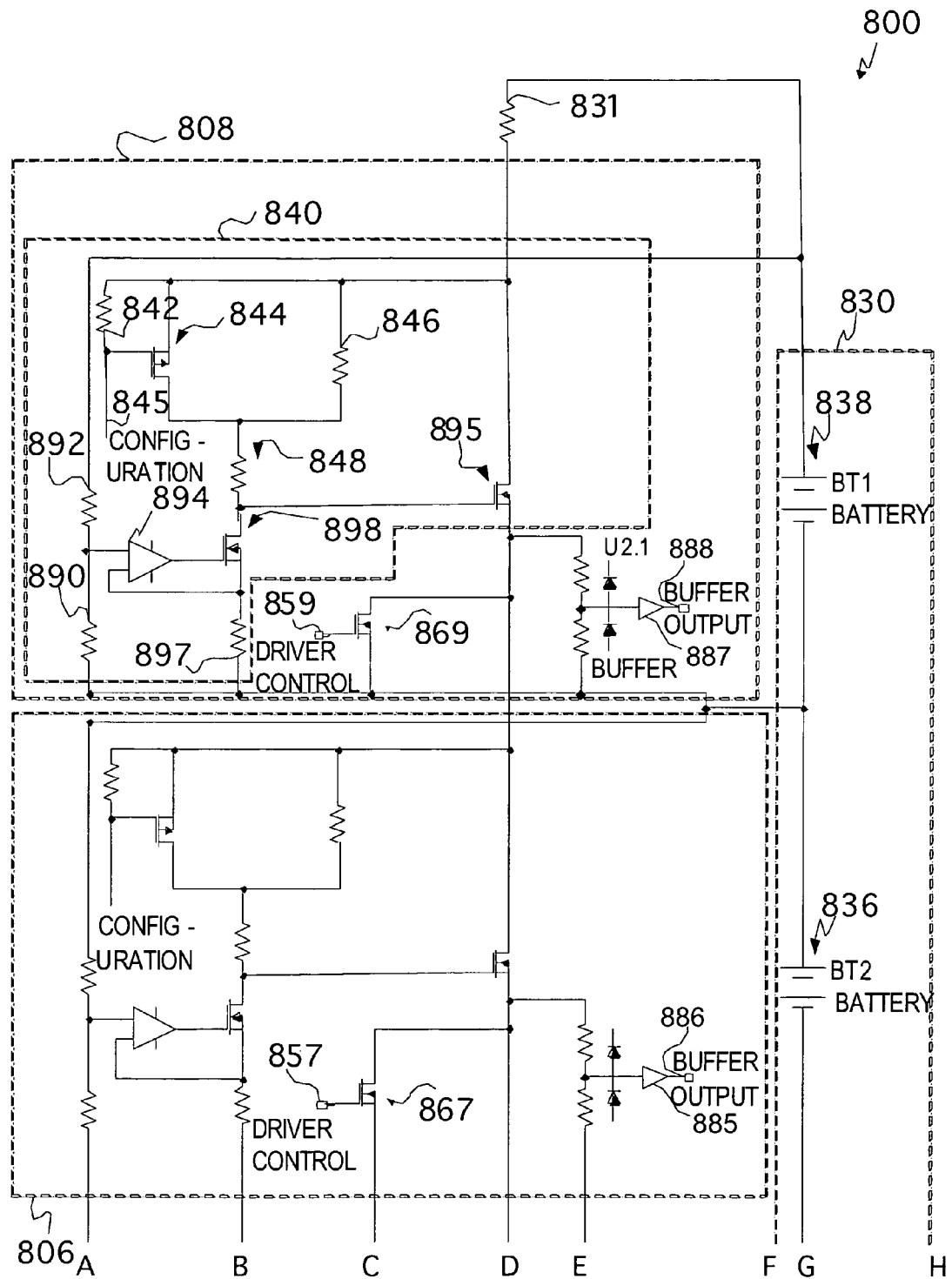
FIG. 8a and FIG. 8b are block diagrams showing a non-common ground bus topology or circuit with float voltage sources according to an embodiment of the present invention.
Figure 8B:
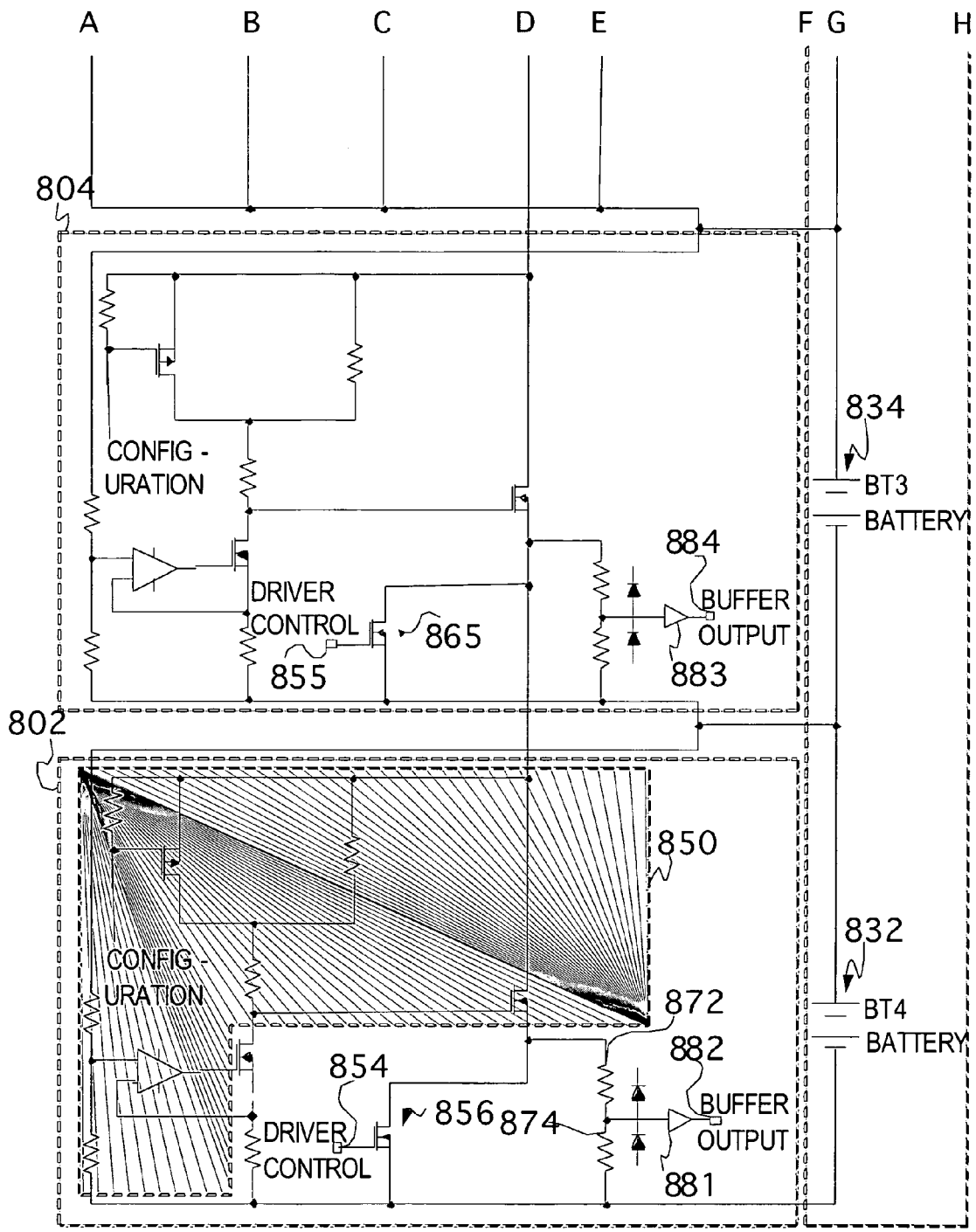

Referring to FIG. 8a and FIG. 8b, a non-common ground bus circuit 800 according to an embodiment of the present invention is illustrated. The bus circuit 800 includes four bus blocks 802, 804, 806 and 808, which can be identical and be formed as an individual integrated circuit. The bus blocks 802, 804, 806 and 808 are coupled to four battery packs 832, 834, 836 and 838 of a battery 830.

For clarity, the bus blocks 802 and 808 will be described hereinafter in detail as an example. As illustrated in FIG. 8a and FIG. 8b, the bus block 802 comprises a float voltage source 850, which is coupled to a switch 856 and a buffer 881. The voltage of float voltage source 850 is proportional to the voltage of the battery pack 832. The switch 856 is controlled by a signal input node 854. The output of the buffer 881 is served as a signal output node 882. In this arrangement, the bus block 802 of the bus circuit 800 is similar to the bus block 702 of the bus circuit 700 shown in FIG. 7.

When all of the signal input nodes 855, 857, 859 of the bus blocks 804, 806 and 808 allow the switches 865, 867, 869 to be open, the output of the output nodes 882, 884, 886 and 888 of the buffers 881, 883, 885 and 887 will be varied with the input signal of the signal input node 854.

The bus block 808 includes two resistors 892 and 890, an operational amplifier 894, a MOSFET 898, and a resistor 897. One of the input nodes of the operational amplifier 894 is coupled to both the resistors 892 and 890. The gate of the MOSFET 898 is coupled to the output of the operational amplifier 894. The resistor 897 is coupled to another input of the operational amplifier 894 and the source of the MOSFET 898. Accordingly, a reference current is generated and is proportional to the voltage of the voltage pack 838. The bus block 808 further comprises a resistor 848 coupled to the MOSFET 898 and a MOSFET 895, the gate of which is coupled to the resistor 848 so as to form a float voltage source 840.

As described hereinbefore, the voltage source in the highest stage generates less voltage than the voltage of the corresponding battery pack, and the voltage source in the rest of the stage generate voltages equal to the voltage of the corresponding battery pack.

Also, the voltage source 840 includes a switch 844 for coupling a resistor 846 to the resistor 848 of the voltage source 840. The switch 844 is controlled by a configure pin 845.

Each of bus blocks 802, 804, 806 and 808 can be formed as an identical integral circuit (IC) chip, in one embodiment.

As shown in FIG. 8a and FIG. 8b, the bus block 808 is in the highest stage, and the input of the configure pin 845 will be kept low and the switch 844 will be kept closed such that the voltage across the voltage source 840 of the bus block 808 is lower than the voltage across the voltage source 850 of the bus block 802. The input of the configure pins of the rest of the bus blocks 802, 804 and 806 are kept high.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A communication circuit for transmitting data comprising:
   a plurality of vertical devices which have a plurality of non-common ground voltages;
   at least one lateral device, wherein said lateral device is at the lowest order ground voltage of said plurality of non-common ground voltages;
   a plurality of vertical transmitting input nodes coupled to said plurality of vertical devices, respectively;
   a lateral transmitting input node coupled to said lateral device; and
   a transmitting current path coupled to said plurality of vertical transmitting input nodes and said lateral transmitting input, wherein a current of said transmitting current path is varied according the input signals of said plurality of vertical transmitting input nodes and said lateral transmitting input node.

2. The communication circuit of claim 1, further comprising:
   a lateral receiving output node coupled to said lateral device and said transmitting current path such that said data is transmitted between said vertical devices and said lateral device.

3. The communication circuit of claim 1, further comprising:
   a plurality of vertical receiving output nodes coupled to said vertical device; and
   a receiving current path coupled to said plurality of vertical receiving output nodes and said transmitting current path, wherein a current through said receiving current path is varied according to said current of said transmitting current path such that said data are transmitted from said plurality of vertical transmitting input nodes and said lateral transmitting input node to said plurality of vertical receiving output nodes.

4. The communication circuit of claim 3, further comprising:
   a data communication path for coupling said vertical receiving current path to said transmitting current path such that the current through said receiving current path is varied according to said current of said transmitting current path.

5. The communication circuit of claim 4, wherein said data communication path is at the lowest order ground voltage.

6. The communication circuit of claim 3, wherein said communication circuit complies with I2C series bus protocol.

7. A communication circuit for communicating a signal, comprising:
   a plurality of communication blocks coupled in series, wherein said communication blocks stand on a plurality of non-common ground voltages and each of said communication blocks comprises a current mirror; and
   a signal path through said plurality of communication blocks and for communicating said signal among said communication blocks, wherein a current of said signal path is varied and said signal is communicated based on a variation of said current.

8. The communication circuit of claim 7, further comprising:
   an output device coupled to said signal path and configured to generate an output value based on said signal.

9. The communication circuit of claim 7, wherein said signal path comprises a transmitting current path through said plurality of communication blocks for transmitting said signal among said plurality of communication blocks.

10. The communication circuit of claim 9, wherein said signal path further comprises a receiving current path through said plurality of communication blocks for receiving said signal from said transmitting current path.

11. The communication circuit of claim 7, further comprising:
   a plurality of voltage sources, wherein a voltage across each of said plurality of voltage sources is less than a voltage across a corresponding device when said input of said input pin of said corresponding device is kept at said predetermined logic value, and wherein a voltage across each of said plurality of voltage sources is equal to said voltage across said corresponding device when said input of said input pin of said corresponding device is not kept at said predetermined logic value.

12. The communication circuit of claim 7, wherein said communication circuit complies with I2C series bus protocol.

13. The communication circuit of claim 7, wherein each of said plurality of communication blocks is formed as an integral circuit (IC) chip.

14. A communication circuit for communicating between devices, comprising:
   a plurality of devices standing on a plurality of non-common ground voltages;
   a plurality of transmitting input nodes coupled to said plurality of devices;
   a transmitting current path coupled to said plurality of transmitting input nodes, wherein a current through said transmitting current path is varied according to an input signal of said transmitting input nodes, such that data is communicated between said plurality of devices;
   a plurality of receiving output nodes coupled to said plurality of devices; and
   a receiving current path coupled to said plurality of receiving output nodes, wherein a second current through said receiving current path is varied according to said current of said transmitting current path such that said data is transmitted from said plurality of transmitting input nodes to said plurality of receiving output nodes.

15. The communication circuit of claim 14, further comprising:
   a data communication path for coupling said receiving current path to said transmitting current path such that said second current through said receiving current path is varied according to said current of said transmitting current path.

16. The communication circuit of claim 15, wherein said data communication path is at a lowest order ground voltage.

17. The communication circuit of claim 15, wherein said data communication path comprises a resister coupled to a voltage source.

18. The communication circuit of claim 17, wherein a low state voltage is generated on said resistor in response to inputting a low state voltage into one of said transmitting input nodes.

19. The communication circuit of claim 17, wherein a high state voltage is generated on said resistor in response to respectively inputting a plurality of high state voltages into each one of said transmitting input nodes.

* * * * *